United States Patent [19]
Pierrat

[11] Patent Number: 5,935,734
[45] Date of Patent: Aug. 10, 1999

[54] METHOD FOR FABRICATION OF AND APPARATUS FOR USE AS A SEMICONDUCTOR PHOTOMASK

[75] Inventor: Christophe Pierrat, Boise, Id.

[73] Assignee: Micron Technology, Inc., Boise, Id.

[21] Appl. No.: 08/796,650

[22] Filed: Mar. 3, 1997

[51] Int. Cl.[6] .................................................... G03F 1/08
[52] U.S. Cl. .......................... 430/5; 430/323; 430/330; 430/394; 216/12
[58] Field of Search ............................... 430/5, 321, 323, 430/329, 330, 394

[56] References Cited

U.S. PATENT DOCUMENTS

| | | | |
|---|---|---|---|
| 4,409,319 | 10/1983 | Colacino et al. | 430/296 |
| 5,338,626 | 8/1994 | Garofalo et al. | 430/5 |
| 5,411,824 | 5/1995 | Vasudev et al. | 430/5 |
| 5,455,131 | 10/1995 | Kang et al. | 430/5 |
| 5,472,811 | 12/1995 | Vasudev et al. | 430/5 |
| 5,487,963 | 1/1996 | Sugawara | 430/5 |
| 5,549,995 | 8/1996 | Tanaka et al. | 430/5 |
| 5,718,991 | 2/1998 | Lin et al. | 430/5 |

*Primary Examiner*—Bernard Codd
*Attorney, Agent, or Firm*—Fletcher, Yoder & Van Someren

[57] ABSTRACT

A method for fabricating photomasks including forming a resist layer located over a substrate, and heating the substrate at a temperature greater than the glass transition temperature of the resist, such that the resist layer flows. In this manner, defects such as pinholes within the resist layer are reduced.

20 Claims, 2 Drawing Sheets

METHOD FOR FABRICATION OF AND APPARATUS FOR USE AS A SEMICONDUCTOR PHOTOMASK

FIELD OF THE INVENTION

The present invention relates generally to a photomask used in a lithography process and, more specifically, to a method of fabricating a photomask for use in semiconductor fabrication.

BACKGROUND OF THE RELATED ART

A photomask may be used to transfer a pattern to a semiconductor wafer. The pattern, which is transferred onto the wafer, may be first formed on a photomask substrate that is substantially transparent. The substrate includes thin films of metal or other nontransparent material, which act to block light passing through the photomask substrate. In this way, a pattern is transferred onto the semiconductor wafer for use during semiconductor processing. In particular photomasks, the nontransparent material may be a chrome material, such as opaque chrome.

Due to limitations imposed by the wavelength of light used to transfer the pattern, resolution at the edges of the patterns of the photomask degrades when ordinary optical techniques are used. Standard optical techniques using ultra violet (UV) light may extend the lower range, but still fall short of desired resolution at low ranges (under 0.25 microns). Use of phase-shifting photomasks is one method of increasing the resolution of patterns by creating phase-shifting regions in the transparent areas of a photomask.

Standard phase shift masks generally are formed either by depositing transparent films of appropriate thickness and patterning them over the desired transparent areas using a second level lithography and etch technique, or by etching vertical trenches in the substrate. In both of these instances, the "edges" or "walls" between the phase shifted and unshifted regions generally result in a transition between high and low refractive index regions. This transition of the refractive index and the three dimensional structure causes scattering of light due to internal reflections at the edges and causes the transmitted light intensity and spatial profile to vary between the shifted region and the unshifted region.

One method of forming a phase-shifting photomask is to utilize a material that is substantially nontransparent, such as opaque chrome to define the device pattern. This pattern may be fabricated using standard lithography processes. For example, a layer of chrome may be deposited on a quartz substrate by known techniques. Then a resist layer may be formed on the substrate and patterned using standard lithography processes. The patterned resist creates openings which expose the chrome layer. Then an etching process is performed in which openings are created that expose the quartz layer. Then the resist layer is removed and a second layer of resist is applied. This layer may be patterned to expose certain portions of the quartz, while covering other portions. Next, an etching step is performed which creates trenches in the exposed portions of the quartz layer. Finally, the remaining resist may be stripped from the substrate. The trenches formed in the quartz thereby effectively shift light 180°, and thereby increase the resolution of patterns created on semiconductor wafers by the photomask. In certain embodiments, it may be possible to deposit an oxide layer over the patterned chrome layer, and then pattern this oxide layer.

Several problems exist with this method of fabricating phase-shifting masks. First, the resist layers may contain pinholes. These pinholes may be any size. Presence of pinholes can create defects within a photomask. For example, a resist layer is used to block a lower layer during an etch process. The etch process will impinge and cause the etchant chemicals to flow into the pinhole, thereby etching an undesired portion of a lower layer. Another problem is that unwanted resist residues may remain on the photomask. A method of reducing pinholes is to improve the resist quality; however this does not completely prevent the presence of pinholes.

SUMMARY OF THE INVENTION

The present invention provides a method of fabricating a photomask including, for example, the following steps: forming a patterned resist layer located over a first layer, where the first layer is located over a substrate, thereby creating openings exposing portions of the first layer, and heating the substrate, thereby causing the patterned resist layer to flow. In exemplary embodiments, the heating step may be performed at a temperature greater than a glass transition temperature of the resist. In other exemplary embodiments, the first layer may be substantially nontransparent and may comprise a metallic material, such as chrome. In yet other exemplary embodiments, the substrate may be substantially transparent and be comprised of, for example, quartz. The methods of the present invention may be used to reduce defects, such as pinholes, in the photomask.

An alternate method of the present invention may include fabricating a photomask by performing the steps of obtaining a substrate having a resist layer located above it; and heating the substrate, thereby causing the resist layer to flow.

BRIEF DESCRIPTION OF THE DRAWINGS

A better appreciation of the present embodiment may be gained from a study of the specific disclosed embodiments and of the drawings in which.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims.

DETAILED DESCRIPTION OF SPECIFIC EMBODIMENTS

There is disclosed a method in which defects created during fabrication of photomasks are reduced. The method may be used with phase-shifting photomasks, but may also be used with non phase-shifting photomasks.

Figure 1:
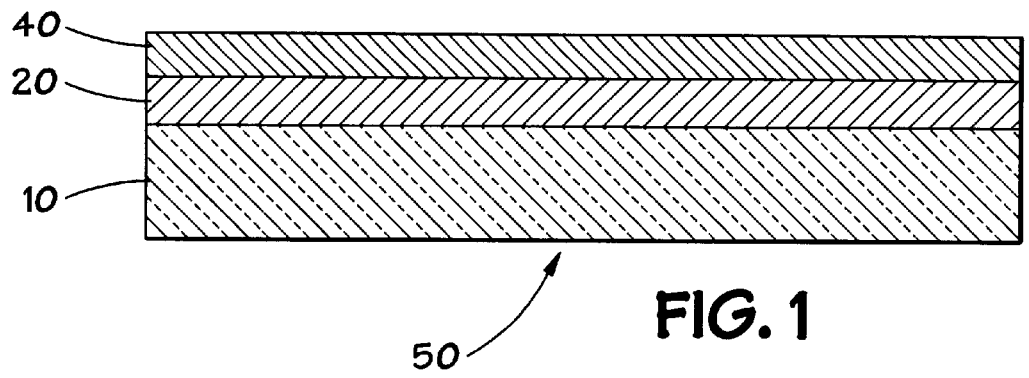
FIG. 1 is a cross-sectional diagram showing a substrate covered by a first layer and a resist layer.
Figure 2:
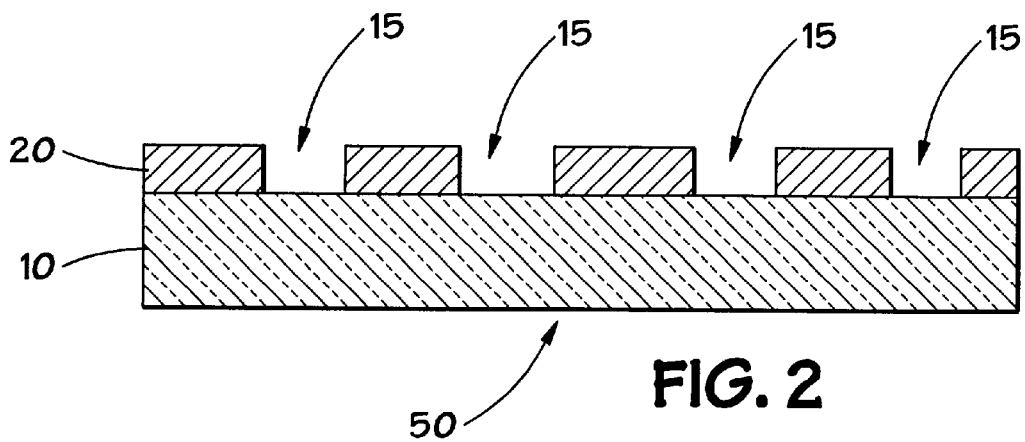
FIG. 2 is a cross-sectional diagram showing a patterned first layer, exposing portions of the substrate.
Figure 3:
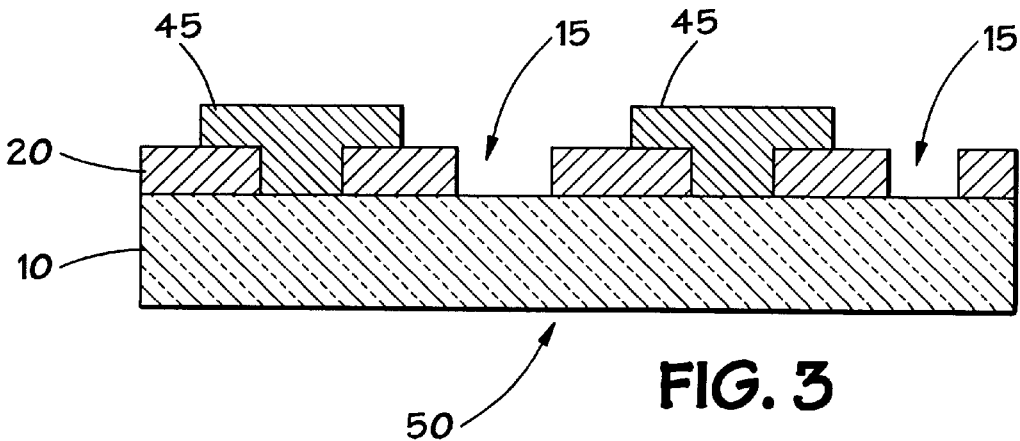
FIG. 3 is a cross-sectional diagram showing a patterned first layer, having a patterned resist layer above it.

FIGS. 1–3 show a method of fabricating a mask blank having a patterned opaque layer as known in the prior art. A substrate 10, which may be quartz, glass, or any other substantially transparent material, is used as the base of mask blank 50. A first layer 20 may be comprised of a light-blocking material that is substantially nontransparent, such as chrome, a mixture of chrome, oxygen and nitrogen, or a mixture of molybdenum, silicon and oxygen. The first layer 20 may be typically between 80 and 130 nm thick, and more advantageously between 90 and 120 nm thick. The first layer 20 may be deposited by known techniques, such as CVD, RF sputtering, or the like. As shown herein, the first layer 20 is directly on a blank substrate 10. However, it will be recognized that the substrate may include various intermediate process layers. Thus, as used herein one layer may be "on" another layer even if intermediate layers are formed between the two layers.

Over the first layer 20, a layer 40 of resist may be placed, as shown in FIG. 1. The resist layer 40 may be patterned using standard lithography techniques to form openings, thereby exposing portions of the first layer 20.

Then, a process, such as a dry etching process, may be used to etch openings 15 into the first layer 20. This etch process may use, for example gas mixtures such as Cl2, and O2, or CF4 and O2, to etch the openings in the first layer 20. Other etching processes, such as wet etching using Cyantek CR-7S may be used to etch these openings. The etching thereby creates patterned openings 15, as shown in FIG. 2. These openings expose the substrate layer 10. It is to be understood that the number and location of openings are exemplary, and a particular mask may utilize more or less openings.

Next, a layer of resist 45 is coated over the substrate layer 10 and the first layer 20. The resist layer 45 may then be patterned, using standard lithography techniques, to expose and develop the desired image. The result of this process thereby exposes portions of the first layer 20 and the substrate 10 and blocks other portions, as shown in FIG. 3. Typical resists utilized for layers 40 and 45 include UV-sensitive resists such as 895i, commercially available from OCG, or an E-beam-sensitive resist such as PBS (polybutene sulfone), commercially available from Mead Chemicals.

Figure 4:
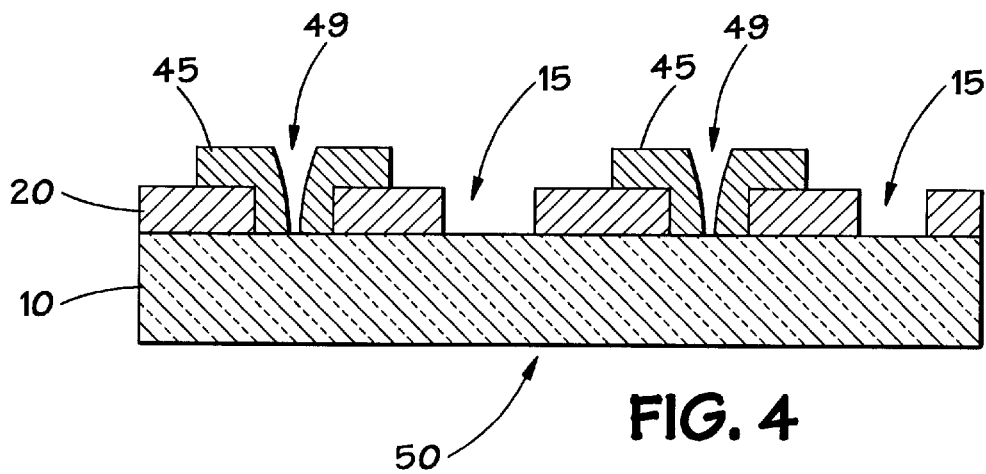
FIG. 4 is a cross-sectional diagram showing a patterned resist layer having pinholes.

The above steps are known in the prior art and are performed during the fabrication of a photomask. In particular, such techniques are often utilized during the fabrication of phase-shifting masks. However, for several reasons pinholes 49 may be present within the remaining resist layer 45, as shown in FIG. 4. The pinholes 49 may be created due to resist impurities and from particles present on the surface of the blank during the resist coating process.

Pursuant to the present invention, a photomask having a layer of resist may be heated to bake the resist layer. The heating step may be provided by placing the photomask in close proximity to a heating element, such as a furnace, oven, resistive heating element, coil heater, fan heating, contact with a hot plate, or the like. The temperature of the heating element is a function of the resist used. The temperature may be selected to be close to the glass transition temperature to achieve a flow of the resist. For example, with use of the 895i resist, the temperature may be between approximately 120° C. and 150° C. The photomask may be heated to a temperature that causes the resist layer 45 to flow, thereby causing the pinholes 49 to fill as shown in FIG. 5.

In exemplary embodiments, such a resist flow may occur at a temperature greater than a glass transition temperature of the resist. The heating process may take between approximately 30 seconds and 2 hours, and more advantageously between approximately 30 seconds and 2 minutes. After heating, in an exemplary embodiment, the photomask may be allowed to cool for between approximately 1 and 30 minutes, or more advantageously between approximately 1 and 15 minutes before further processing occurs. Alternately, the photomask may be allowed to cool to a room temperature before processing continues. It is to be noted that a heat sink may be used to accelerate the cooling process.

The heating step may be performed at a temperature which is high enough to cause the resist to flow. This temperature may be selected so that the resist overcomes surface tension and flows such that the pinholes 49 disappear, as shown in FIG. 5. It is to be noted that this temperature may be experimentally adjusted according to the particular type of resist used. However the temperature may be chosen such that the resist does not flow to an extent that the pattern is lost. In the example shown, the pattern would be lost if the resist 45 flows beyond the first layer 20. Thus, as shown in FIG. 5, a temperature has been selected which allows pinholes 49 to fill and which deforms the resist layer 45 at its edges, but which does not deform the pattern to the extent that the pattern is no longer sufficiently defined for its use. The particular extent that the edges of the patterns of layer 45 may deform may depend on the overlay tolerance between layer 45 and chrome layer 20. In standard phase-shifting techniques, the distance from an edge of layer 45 to an edge of chrome layer 20 is often from approximately 0.2 to 0.6 microns. Thus, the edge of the resist layer 45 may be deformed without changing the dimensions of trenches 13 (FIG. 6) which are defined by the edges of chrome layer 20.

Figure 5:
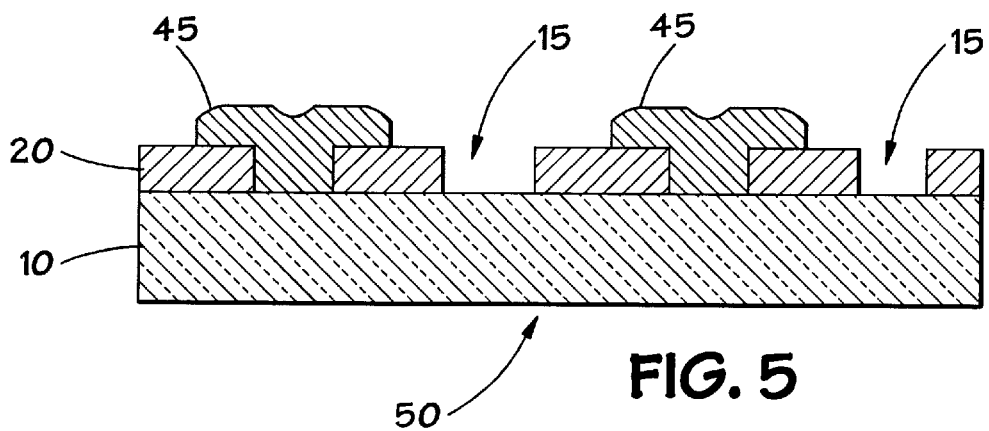
FIG. 5 is a cross-sectional diagram showing a patterned resist layer according to the methods of the present invention.

As shown in FIG. 5, the method of the present invention may be used in fabrication of an alternating aperture or Levenson-type phase-shifting photomask. Specifically, in such a photomask, it is not important to sharply define the edges of the patterned resist layer 45. This is because the first layer 20, which may comprise a metal layer, such as chrome, may act as a self-aligning tool during etching of the substrate itself. Thus, the first layer 20 itself defines the edge of the substrate 10 portion that is to be etched. In this type of mask, the temperature of the heating step may be slightly higher to allow for more pinholes to disappear, so long as the flowed patterned resist does not extend beyond the first layer. Therefore the methods and apparatus of the present invention are particularly appropriate for a hard or Levenson-type phase-shifting photomask.

It is to be noted that pinholes need not be present nor the location of pinholes be known to perform the methods of the present invention. The methods of the present invention may be used in conjunction with prior art methods of fabricating a photomask, such as discussed above. In such a method, the heating method of the present invention may be applied to the first resist layer, as well as the second resist layer. Further, the present invention contemplates using the heating method with one, several, or all resist layers that may be present during the fabrication of a photomask. The heating methods of the present invention may be performed on a resist layer before or after it has been patterned.

FIG. 5 illustrates a photomask after a heating process has occurred. In FIG. 5, the pinholes of FIG. 4 have disappeared. Also, the resist layer 45 has become slightly more amorphous and less defined. However, as discussed above, the resist layer 45 may be allowed to flow so long as the patterned resist layer 45 does not exceed beyond the first layer 20 located below it. FIG. 5 thus shows a photomask fabricated according to the present invention.

Figure 6:
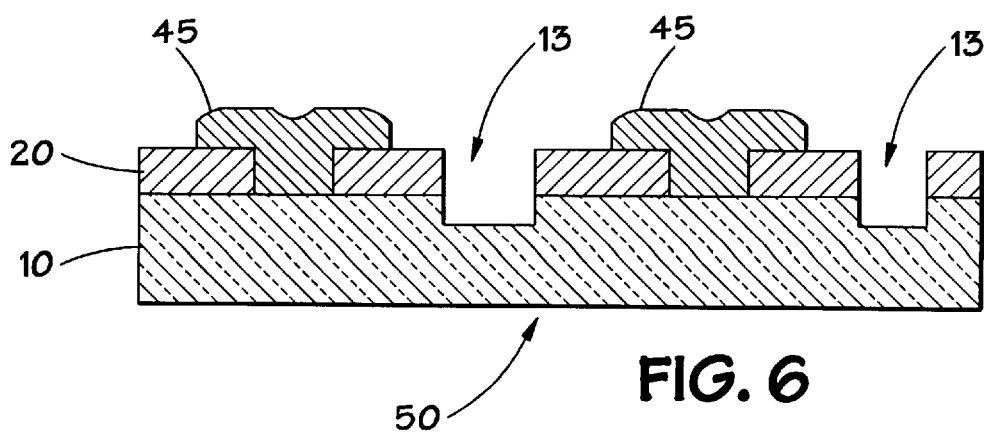
FIG. 6 is a cross-sectional diagram showing a patterned phase-shifting photomask according to the methods of the present invention.

After heating and cooling the photomask, continued processing may occur. In exemplary embodiments, it may be desired to create a phase-shifting photomask by next performing an etch process, such as a dry etching step, such as shown in FIG. 6. In this step, trenches 13 are patterned in the substrate 10, thereby creating a phase-shifting layer as shown in FIG. 6. Next, the remaining resist layer 45 may be removed by stripping or other such processing step, and further desired fabrication steps may be performed.

The present invention thereby creates photomasks having fewer defects because a heating process is applied to a resist layer, thereby reducing the presence of pinholes in the resist layer. Since pinholes present in the resist layer have been reduced by heating the substrate 10, the methods of the present invention thereby prevent transfer of pinholes into photomask layers located below the resist layer. Because these lower layers do not have pinholes, the number of defects in a photomask are reduced. Specifically, the methods of the present invention may reduce the number of defects generated during the fabrication of phase-shifting masks.

What is claimed is:

1. A method of fabricating a photomask comprising the acts of:
   (a) providing a photomask substrate;
   (b) disposing a layer of opaque material on the photomask substrate;
   (c) disposing a first layer of photoresist over the layer of opaque material;
   (d) patterning the first layer of photoresist to form openings in the first layer of photoresist;
   (e) etching the layer of opaque material through the openings in the patterned first layer of photoresist to create corresponding openings in the layer of opaque material;
   (f) removing the patterned first layer of photoresist;
   (g) disposing a second layer of photoresist over the layer of opaque material and over the openings in the layer of opaque material;
   (h) patterning the second layer of photoresist to block a first portion of the openings in the layer of opaque material and to expose a second portion of the openings in the layer of opaque material, wherein the edges of the second layer of photoresist are approximately 0.2 to 0.6 microns from the corresponding edges of the second portion of the openings in the layer of opaque material;
   (i) heating the patterned second layer of photoresist blocking the first portion of the openings in the layer of opaque material to cause the patterned second layer of photoresist to flow without blocking any of the second portion of the openings in the layer of opaque material;
   (j) etching the photomask substrate through the second portion of the openings in the layer of opaque material to create corresponding openings in the photomask substrate; and
   (k) removing the patterned second layer of photoresist.

2. The method, as set forth in claim 1, wherein the photomask substrate comprises a substantially transparent substrate.

3. The method, as set forth in claim 1, wherein act (i) comprises the act of heating for a time period between 30 seconds and 2 hours.

4. The method, as set forth in claim 1, wherein act (i) comprises the act of allowing the patterned second layer of photoresist to cool subsequent to heating.

5. The method, as set forth in claim 1, wherein act (i) comprises the act of heating to a temperature between 120 degrees Celsius and 150 degrees Celsius.

6. The method, as set forth in claim 1, wherein acts (a) through (k) are performed in the order recited.

7. A method of fabricating a photomask comprising the acts of:
   (a) disposing a first layer of photoresist over a layer of opaque material on a photomask substrate;
   (b) patterning the first layer of photoresist to form openings in the first layer of photoresist;
   (c) etching the layer of opaque material through the openings in the first layer of photoresist to create corresponding openings in the layer of opaque material;
   (d) disposing a second layer of photoresist over the layer of opaque material and over the openings in the layer of opaque material;
   (e) patterning the second layer of photoresist to block a first portion of the openings in the layer of opaque material and to expose a second portion of the openings in the layer of opaque material, wherein the edges of the second layer of photoresist are approximately 0.2 to 0.6 microns from the corresponding edges of the second portion of the openings in the layer of opaque material;
   (f) heating the patterned second layer of photoresist blocking the first portion of the openings in the layer of opaque material to cause the patterned second layer of photoresist to flow without blocking any of the second portion of the openings in the layer of opaque material;
   (g) etching the photomask substrate through the second portion of the openings in the layer of opaque material to create corresponding openings in the photomask substrate; and
   (h) removing the patterned second layer of photoresist.

8. The method, as set forth in claim 7, wherein the photomask substrate comprises a substantially transparent substrate.

9. The method, as set forth in claim 7, wherein act (f) comprises the act of heating for a time period between 30 seconds and 2 hours.

10. The method, as set forth in claim 7, wherein act (f) comprises the act of allowing the patterned second layer of photoresist to cool subsequent to heating.

11. The method, as set forth in claim 7, wherein act (f) comprises the act of heating to a temperature between 120 degrees Celsius and 150 degrees Celsius.

12. The method, as set forth in claim 7, wherein act (c) comprises the act of removing the first layer of photoresist subsequent to etching.

13. The method, as set forth in claim 7, wherein acts (a) through (h) are performed in the order recited.

14. A method of fabricating a photomask comprising the acts of:
   (a) providing photomask substrate having a layer of material having openings therein;
   (b) patterning a layer of photoresist over the substrate to block a first portion of the openings in the layer of material and to expose a second portion of the openings in the layer of material, wherein the edges of the layer of photoresist are approximately 0.2 to 0.6 microns from the corresponding edges of the second portion of the openings in the layer of material;

(c) heating the patterned layer of photoresist to cause the patterned layer of photoresist to flow without blocking any of the second portion of the openings in the layer of material;

(d) processing the photomask further; and (h) removing the patterned layer of photoresist.

15. The method, as set forth in claim 14, wherein the layer of material comprises a layer of opaque material.

16. The method, as set forth in claim 14, wherein the photomask substrate comprises a substantially transparent substrate.

17. The method, as set forth in claim 14, wherein act (c) comprises the act of heating for a time period between 30 seconds and 2 hours.

18. The method, as set forth in claim 14, wherein act (c) comprises the act of allowing the patterned layer of photoresist to cool subsequent to heating.

19. The method, as set forth in claim 14, wherein act (c) comprises the act of heating to a temperature between 120 degrees Celsius and 150 degrees Celsius.

20. The method, as set forth in claim 14, wherein act (d) comprises the act of etching the photomask substrate through the second portion of the openings in the layer of material to create corresponding openings in the photomask substrate.

* * * * *

UNITED STATES PATENT AND TRADEMARK OFFICE
CERTIFICATE OF CORRECTION

PATENT NO. : 5,935,734
DATED : August 10, 1999
INVENTOR(S) : Christophe Pierrat

It is certified that error appears in the above-identified patent and that said Letters Patent is hereby corrected as shown below:

Please insert the following paragraph immediately after the title:

-- GOVERNMENT LICENSE RIGHTS

The U.S. Government has a paid-up license in this invention and the rights in limited circumstances to require the patent owner to license others on reasonable terms as provided for by the terms of Contract No. MDA972-92-C-0054 awarded by the Advanced Research Projects Agency (ARPA). --

Signed and Sealed this

Twenty-eighth Day of August, 2001

*Attest:*

NICHOLAS P. GODICI
*Attesting Officer*    *Acting Director of the United States Patent and Trademark Office*